(12) United States Patent
Zhu et al.

(10) Patent No.: US 8,659,461 B1
(45) Date of Patent: Feb. 25, 2014

(54) ANALOG TO DIGITAL CONVERTER CIRCUIT

(71) Applicant: University of Macau, Macau (CN)

(72) Inventors: Yan Zhu, Macau (CN); Chi-Hang Chan, Macau (CN); Sai-Weng Sin, Macau (CN); Seng-Pan U, Macau (CN); Rui Paulo da Silva Martins, Macau (CN); Franco Maloberti, Torre d'Isola (IT)

(73) Assignee: University of Macau, Macau (CN)

( * ) Notice: Subject to any disclaimer, the term of this patent is extended or adjusted under 35 U.S.C. 154(b) by 0 days.

(21) Appl. No.: 13/675,387

(22) Filed: Nov. 13, 2012

(51) Int. Cl.
 *H03M 1/12* (2006.01)
(52) U.S. Cl.
 USPC ........................................ 341/156; 341/155
(58) Field of Classification Search
 USPC ......... 341/156, 155, 161, 162, 163, 172, 110, 341/120
 See application file for complete search history.

(56) References Cited

U.S. PATENT DOCUMENTS 7,884,749 B2 * 2/2011 Furuta et al. .................. 341/161

OTHER PUBLICATIONS

Yan Zhu, Chi-Hang Chan, Sai-Weng Sin, Seng-Pan U, Rui Paulo da Silva Martins, Franco Maloberti, "A 35IJ 10b 160MS/s pipelined-SAR ADC with decoupled flip-around MDAC and self-embedded offset cancellation" in Proc. of IEEE Asian Solid-State Circuits Conference—ASSCC 2011, pp. 61-64, Jeju, Korea, Nov. 14-16, 2011.

* cited by examiner

*Primary Examiner* — Joseph Lauture
(74) *Attorney, Agent, or Firm* — Bacon & Thomas, PLLC (57) ABSTRACT

The present invention provides a pipelined-successive approximation register (SAR) analog-to-digital converter (ADC) circuit with decoupled flip-around MDAC, capacitive attenuation solution and self-embedded offset cancellation. The flip-around MDAC architecture is built for low interstage gain implementation. A capacitive attenuation solution is provided for minimizing the power dissipation and optimizing conversion speed. The design reuses SAR ADC to perform offset cancellation, which significantly saves calibration area, power and time.

7 Claims, 6 Drawing Sheets

ANALOG TO DIGITAL CONVERTER CIRCUIT

FIELD OF THE INVENTION

The present invention relates to an analog to digital converter (ADC), and more particularly, to the time-interleaved pipelined successive approximation register (SAR) ADCs.

RELATED ART

Typically, an analog-to-digital converter (ADC) is used for converting an input analog voltage (or current) to a digital number proportional to the magnitude of the voltage or current.

Analog-to-digital converter (ADC) has various architectures, for example, flash analog-to-digital converters (flash ADC), pipeline analog-to-digital converters (pipeline ADC), and successive approximation register analog-to-digital converters (SAR ADC), all of which has respective application field.

Flash ADC is typically the fastest, but has the highest implementation cost. SAR ADC has a much lower implementation cost, however, it is considerably slower than flash ADC. As to the pipelined ADC, it does not benefit from the technology scaling because the use of low voltage supplies gives rise to an augmented consumption of power.

In view of the deficiency of above analog-to-digital converters, there is a need to provide an ADC with advantage of high speed and low power.

SUMMARY OF THE INVENTION

Therefore, the object of the present invention is to provide a power effective and high-speed ADC. Embodiments of SAR ADCs disclosed herein can consume less power than many other ADCs.

According to an embodiment of the present invention, there is provided an analog-to-digital converter (ADC) circuit, including: multiple time-interleaved pipelined-successive approximation register (SAR) ADCs, each of the multiple time-interleaved SAR ADCs including: the first stage SAR sub-ADC for coarse conversion, the first stage SAR sub-ADC receiving and converting an analog input signal to generate a digital code and a residue signal; a residue amplifier for amplifying the residue signal generated by the first stage SAR sub-ADC to output a amplified residue signal, wherein the residue amplifier is shared between the multiple time-interleaved pipelined-SAR ADCs; the second stage SAR sub-ADC for fine conversion, the second stage SAR sub-ADC receiving and converting the amplified residue signal to generate a digital code; and a digital error correction logic for receiving and combining the digital code generated by the first stage SAR sub-ADC and the digital code generated by the second stage SAR sub-ADC to generate digital signal that represents the analog input signal, wherein the first stage SAR sub-ADC comprises a plurality of capacitive digital-to-analog converter (CDAC) built as a flip-around Multiplying Digital to Analog Converter (MDAC) for improving feedback factor in the pipelined-successive approximation register (SAR) ADC.

The first stage DAC comprises an n-bit sub-$DAC_C$ array and a capacitive network sub-$DAC_A$ while top-plates of $DAC_C$ and $DAC_A$ are connected together, the $DAC_A$ and $DAC_C$ sample the input signal simultaneously, where n is an integer greater than 1.

According to another embodiment of the present invention, there is provided an analog-to-digital converter (ADC) circuit, including: multiple time-interleaved pipelined-successive approximation register (SAR) ADCs, each of the multiple time-interleaved SAR ADCs including: the first stage SAR sub-ADC for coarse conversion, the first stage SAR sub-ADC receiving and converting an analog input signal to generate a digital code and a residue signal; a residue amplifier for amplifying the residue signal generated by the first stage SAR sub-ADC to output a amplified residue signal, wherein the residue amplifier is shared between the multiple time-interleaved pipelined-SAR ADCs; the second stage SAR sub-ADC for fine conversion, the second stage SAR sub-ADC receiving and converting the amplified residue signal to generate a digital code; and a digital error correction logic for receiving and combining the digital code generated by the first stage SAR sub-ADC and the digital code generated by the second stage SAR sub-ADC to generate digital signal that represents the analog input signal, wherein the second stage SAR sub-ADC comprises DAC array, a capacitor $C_V$ and an capacitive attenuator Catt, and wherein the bottom-plates of the DAC array and the capacitor $C_V$ are connected to the reference and common-mode voltages, respectively.

The residue is sampled at a node between the capacitor $C_V$ and the capacitive attenuator Catt, and the successive approximation conversion is done in the DAC array.

According to another embodiment of the present invention, there is provided an analog-to-digital converter (ADC) circuit, including: multiple time-interleaved pipelined-successive approximation register (SAR) ADCs, each of the multiple time-interleaved SAR ADCs comprising: the first stage SAR sub-ADC for coarse conversion, the first stage SAR sub-ADC receiving and converting an analog input signal to generate a digital code and a residue signal; a residue amplifier for amplifying the residue signal generated by the first stage SAR sub-ADC to output a amplified residue signal, wherein the residue amplifier is shared between the multiple time-interleaved pipelined-SAR ADCs; the second stage SAR sub-ADC for fine conversion, the second stage SAR sub-ADC receiving and converting the amplified residue signal to generate a digital code; and a digital error correction logic for receiving and combining the digital code generated by the first stage SAR sub-ADC and the digital code generated by the second stage SAR sub-ADC to generate digital signal that represents the analog input signal, wherein the second stage SAR sub-ADC calculates a offset voltage and connects to a calibration logic, the calibration logic stores a offset code and applies a complementary offset code to the second stage SAR sub-ADC to cancel the offset voltage.

BRIEF DESCRIPTION OF THE DRAWINGS

Advantages of the disclosed techniques may become apparent upon reading the following detailed description and upon reference to the drawings in which.

DETAILED DESCRIPTION

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

Figure 1:
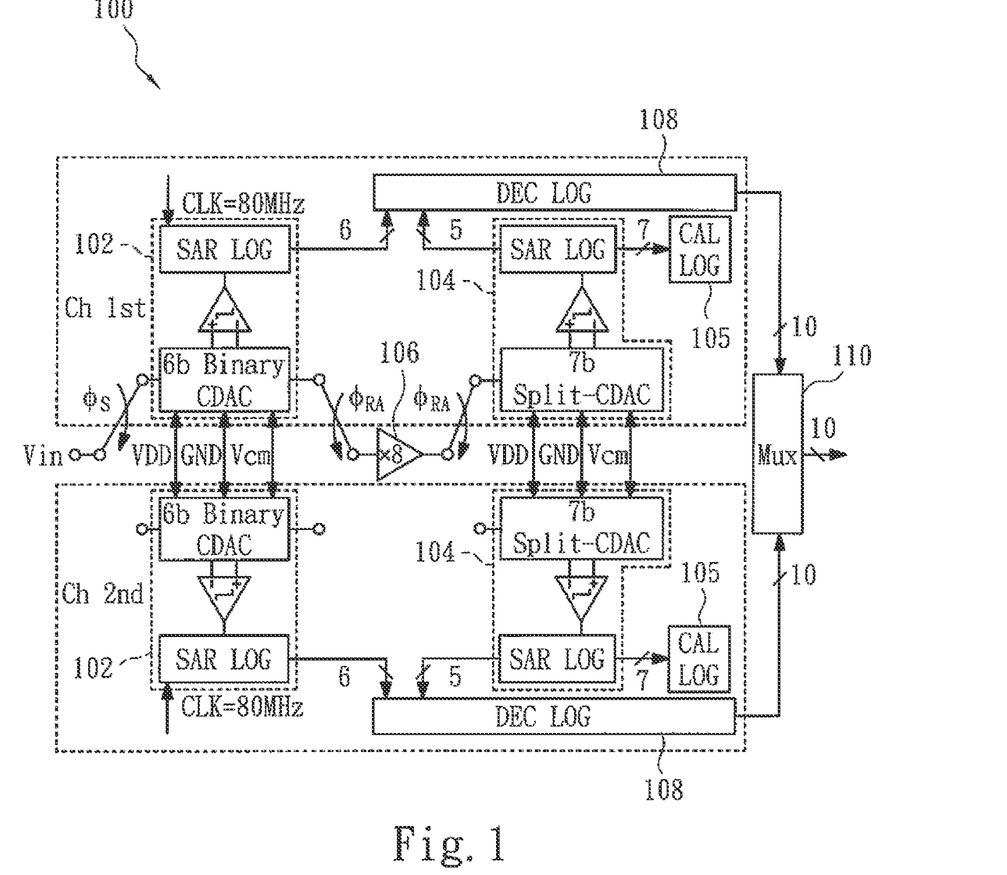
FIG. 1 is a block diagram of an analog to digital converter (ADC) according to an embodiment of the present invention.
Figure 2:
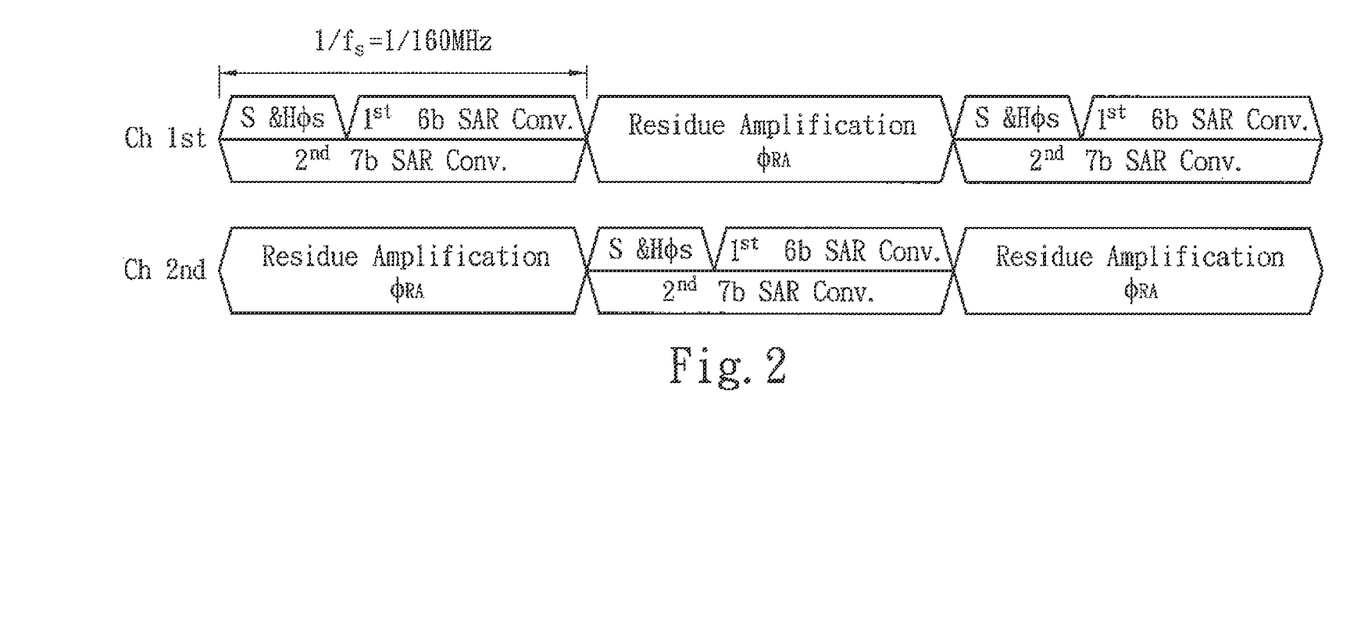
FIG. 2 is a timing diagram illustrating the time relationship of the operation of the analog to digital converter in FIG. 1.

Reference is now made to FIG. 1. FIG. 1 is a block diagram of an analog to digital converter (ADC) according to an embodiment of the present invention. A time-interleaved successive approximation register (SAR) ADC circuit 100 with 10-bit resolution and 160 MS/s sampling rate is shown in FIG. 1. The ADC circuit 100 includes two interleaved pipelined-SAR ADCs. Each of the SAR ADCs comprises a first stage SAR sub-ADC 102, a second stage SAR sub-ADC 104, a residue amplifier 106 and a digital error correction logic 108. FIG. 2 is a timing diagram illustrating the time relationship of the operation of the ADC circuit 100 in FIG. 1.

The first stage SAR sub-ADC 102, which is a 6-bit ADC, receives an analog input signal $V_{in}$ and converts the analog input signal $V_{in}$ to generate a 6-bit digital code. Thus, the first stage SAR sub-ADC 102 converts the coarse 6-bit code and generates the residue at top-plate of the DAC, which is amplified by 8 to the second stage SAR sub-ADC 104. The first stage SAR sub-ADC 102 also generates a residue signal to be amplified by the residue amplifier 106 for the next stage fine conversion.

Residue amplifier 106 is used for amplifying the residue signal generated by the first stage SAR sub-ADC 102 to output an amplified residue signal. The amplified residue signal is then provided as an input to the second stage SAR sub-ADC 104. The residue amplifier 106 is shared by two interleaved pipelined-SAR ADCs. That is, the two time-interleaved two-step SAR ADCs use the same residue amplifier. Since time-interleaved architectures augment the conversion rate but suffer from the offset mismatches. The residue amplification by 8 is a proper trade-off between power limits and accuracy in an embodiment of the present invention.

The second stage SAR sub-ADC 104, which is a 7-bit ADC, receives and converts the amplified residue signal to generate a digital code. The second stage SAR sub-ADC 104 operates in a pipeline fashion while the first stage starts a new cycle.

The second stage SAR sub-ADC 104, calculates a offset voltage and connects to a calibration control logic 105, the calibration logic 105 stores a offset code and applies a complementary offset code to the second stage SAR sub-ADC 104 to cancel the offset voltage.

The digital error correction logic 108 receives the coarse 6-bit digital code generated by the first stage SAR sub-ADC 102 and the fine 5-bit digital code generated by the second stage SAR sub-ADC 104 to output a 10-bit digital code to a multiplexer 110. Thus, each of the SAR ADCs uses 6b and 7b SAR ADCs (additional 2b of second stage is for offset cancellation) with 1 bit overlapping for digital error correction.

Figure 3:
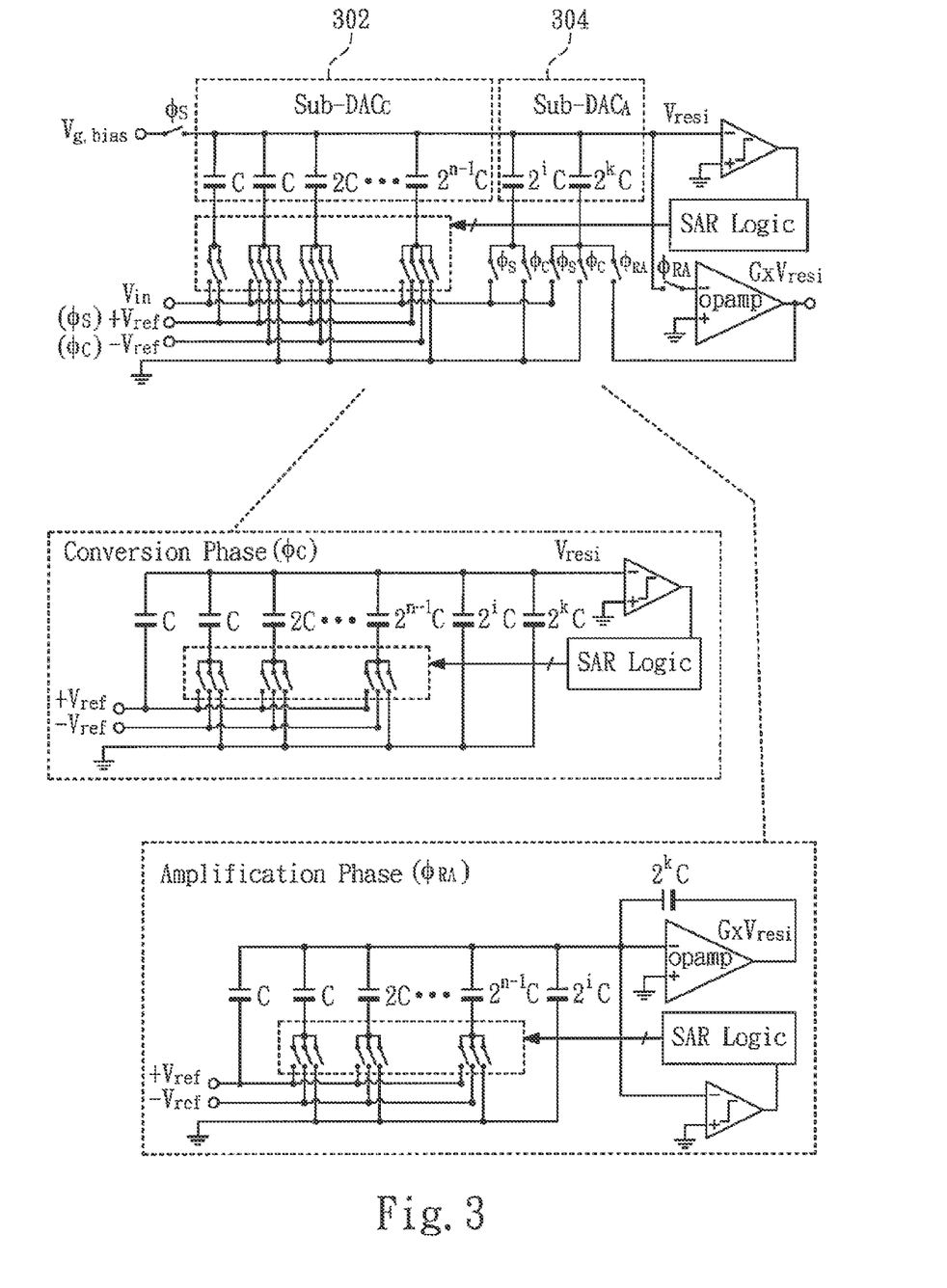
FIG. 3 is a block diagram of a first stage SAR sub-ADC with flip-around MDAC operates during conversion phase and amplification phase.

Reference is now made to FIG. 3. FIG. 3 shows a block diagram of the first stage SAR sub-ADC with flip-around MDAC operates during conversion phase and amplification phase. The first stage SAR sub-ADC comprises a plurality of capacitive digital-to-analog converter (DAC) built as a flip-around MDAC for improving feedback factor in the pipelined-successive approximation register (SAR) ADC. The DAC comprises an n-bit sub-$DAC_C$ array 302 and a capacitive network sub-$DAC_A$ 304 while top-plate of $DAC_C$ and $DAC_A$ are connected together, where n is an integer greater than 1. The bottom-plate of DACA and DACC are connected to input signal during the sampling. The DACC performs the 6b comparison, while the bottom-plate of DACA is kept connected to a common-mode voltage during the conversion. The capacitors in DACA are partially feedback to the output of the residue amplifier, and the feedback capacitance is decided by the desired inter-stage gain. The first stage CDAC array utilized the partial feedback capacitor that allow decoupling the DAC array resolution and the residue gain ratio, thus enabling power efficient flip-around MDAC implementation. The CDACs in the first stage and second stage SAR ADCs are proper designed to perform 8× residue amplification.

Figure 4:
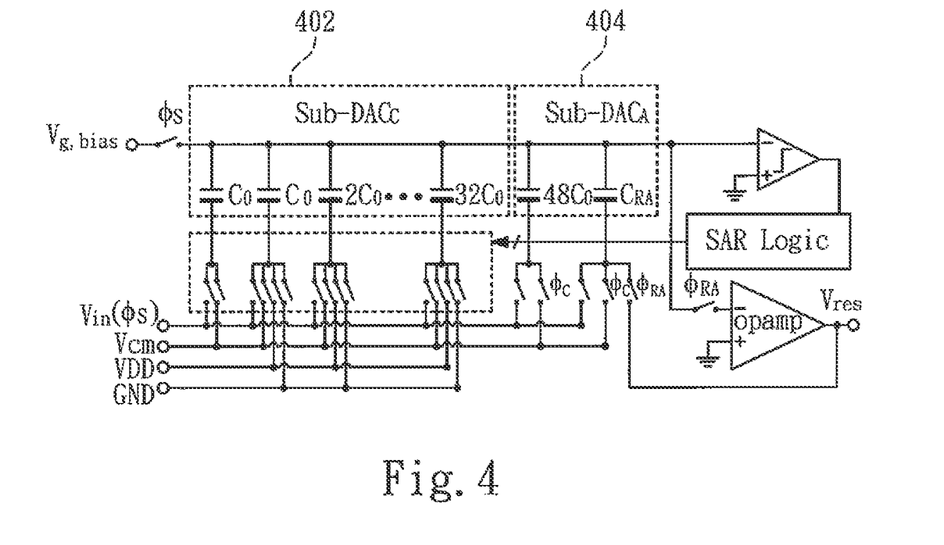
FIG. 4 is a block diagram of a first stage SAR sub-ADC with flip-around MDAC according to an embodiment of the present invention.

FIG. 4 shows a block diagram of a first stage SAR sub-ADC with flip-around MDAC according to an embodiment of the present invention. Referring to FIG. 1 and FIG. 4, a binary weighted DAC with two sub-capacitive arrays $DAC_C$ 402 and $DAC_A$ 404 is utilized, each containing 64 units for different functions. During $\Phi_S$ the input voltage pre-charges the total DAC array. Then, the $DAC_C$ 402 performs 6b binary-searched conversion, while the $DAC_A$ keeps connecting to $V_{cm}$ that serves as the capacitive-dividing by 2 of the supply to match the required reference level. The solution prevents the use of resistive-ladder/buffer for low power consideration. Accordingly, this invention achieves more design benefit from the sub-CDAC for the flip-around MDAC implementation.

After the 6b SA conversion, amplification occurs as a flip-around MDAC. The sub-array $DAC_A$ 404 are separated into $48C_0$ non-feedback units and the other $C_{RA}$ of $16C_0$ that is feedback to op-amp's output for the flip-around amplification by 8. The residue amplification is solely depends on the ratio of $\beta = C_{RA}/C_{total} = \frac{1}{8}$, which is decoupled with the resolution of the complete DAC array.

Figure 5:
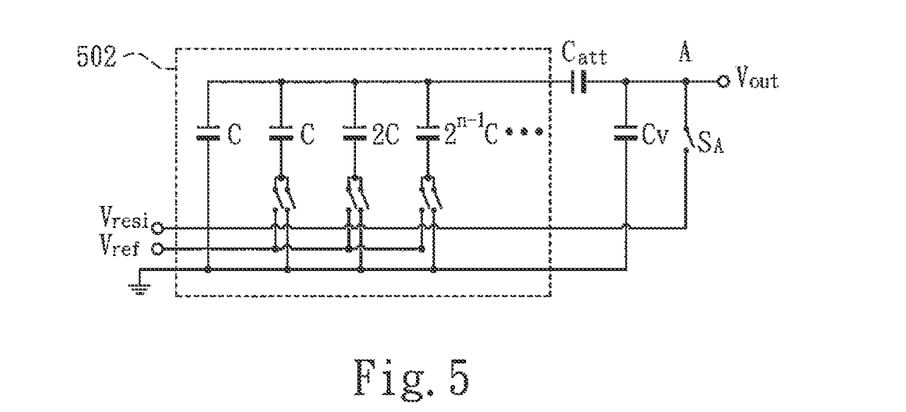
FIG. 5 is a block diagram of DAC array of the second stage SAR sub-ADC.

FIG. 5 shows a block diagram of DAC array of a second stage SAR sub-ADC. The second stage SAR sub-ADC 104 (FIG. 1) comprises a DAC array 502, capacitor $C_V$, and a capacitive attenuator Catt. The bottom-plates of DAC array 502 and capacitor $C_V$ are connected to the reference and the common-mode voltages, respectively. The residue is sampled at node A, and the successive approximation conversion is done in the DAC array 502.

Figure 6:
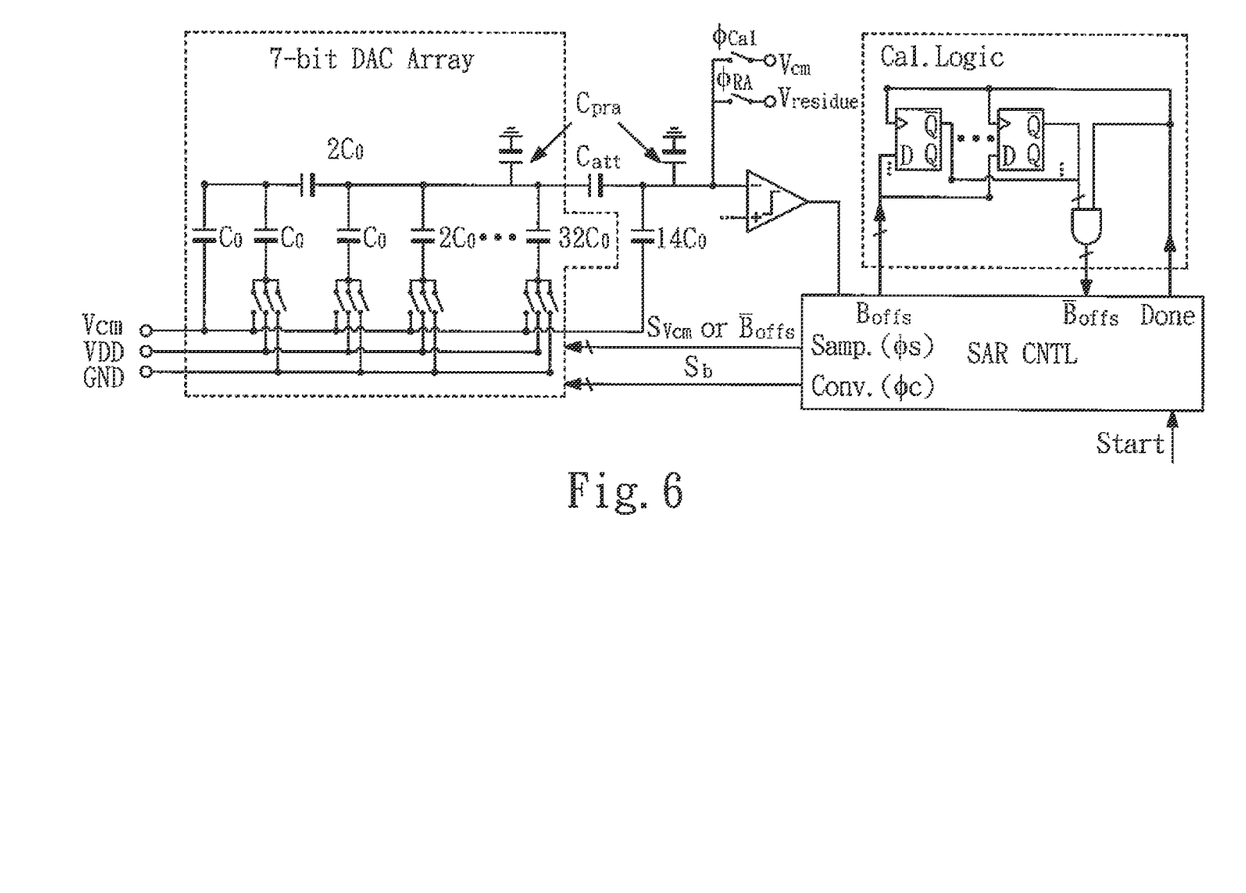
FIG. 6 is a block diagram of the second stage SAR sub-ADC according to an embodiment of the present invention.
Figure 7:
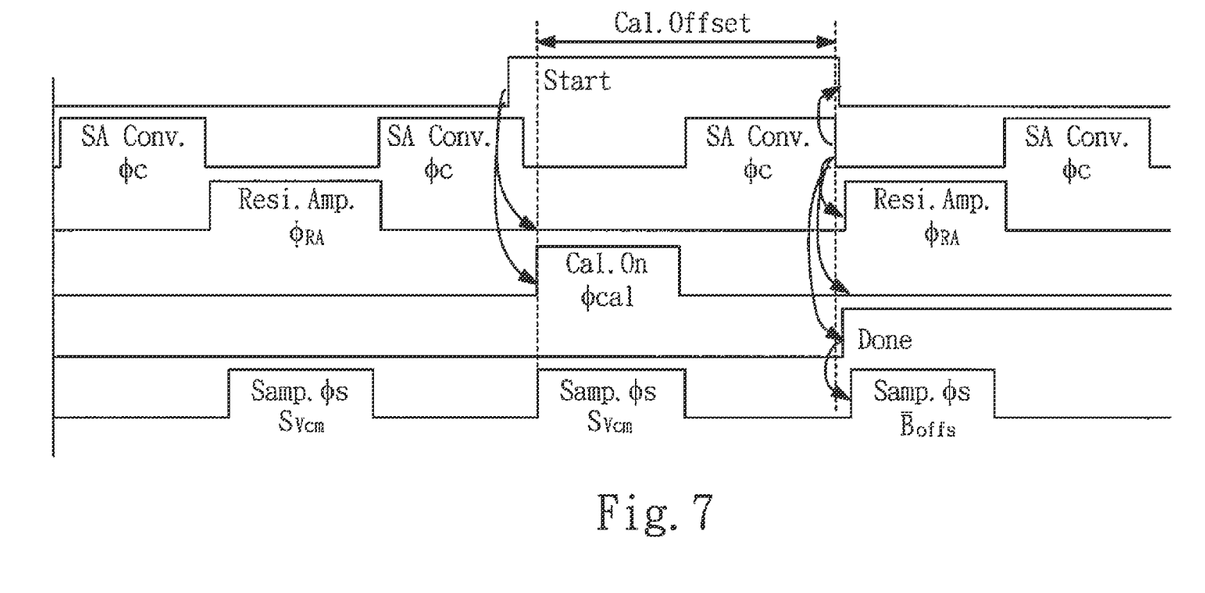
FIG. 7 is a timing diagram illustrating the time relationship of the operation of the analog to digital converter in FIG. 6.

Referring to FIG. 6, a block diagram of a second stage SAR sub-ADC according to an embodiment of the present invention is illustrated. FIG. 7 is a timing diagram illustrating the time relationship of the operation of the analog to digital converter in FIG. 6.

In FIG. 6, a 7b split DAC array used for both conventional SA conversion and offset measurement. In the calibration mode the input of the stage is set to zero. The output of the second stage DAC gives rise to the comparator offset with 9b accuracy. The value is stored on a memory to be subtracted afterwards during the normal SA conversion. As FIG. 6 outlines when calibration is not active (Start=0), the residue is sampled at the top-plate of the DAC by connecting its bottom-plate to $V_{cm}$ during the sampling ($\Phi_S$). Since the input swing is relatively small ($V_{p-p} = \frac{1}{8}V_{DD}$), the top-plate switch is sized smaller to avoid sampling nonlinearity due to the signal dependent charge injection of the switch. When calibration is active (Start=1), the residue amplification phase ($\Phi_{RA}$) is disabled. Both top- and bottom-plates of the DAC are reset to Vcm. Since there is no initial charge in the capacitive array, two inputs of the comparator are set to zero. After 7b conversion ($\Phi_C$) is completed (Done=1), the output of the DAC approximates to the comparator offset voltage according to switch control logic $S_b$, which are locked and stored by 7 flip-flops as offset code Boffs. When the next residue sampling phase $\Phi_{RA}$ appears the offset cancellation is achieved by switching a 7b complementary offset code at DAC's bottom-plate instead of Vcm, consequently, leading to a value of $V_{residue} - V_{offs}$ at the DAC's output for subsequent 5b SA comparison.

The technique allows the maximum offset cancellation range up to full-scale of the second stage reference voltage and compensates the offset with ¼ LSB accuracy. The calibration logic, consisting of dynamic flip-flops and AND gates, are easily implemented with small area costs.

As described above, the invention presents self-embedded offset cancellation and the CDACs for two stage SAR ADCs. The invention reuses the SAR ADC to perform offset cancellation, which enables a more relaxed calibration range with less additional offset calibration effort, thus allowing the implementation of high-speed and low-power comparators. The design of CDACs allows both flip-around MDAC amplification and prevents the use of reference generator that consumes static power.

There are several advantages associated with the present invention, a first of which is that it provides a pipelined-SAR ADC with decoupled flip-around MDAC for improving the feedback factor. A second advantage is associated with the fact that the present invention further provides a pipelined-SAR ADC with a second-stage SAR sub-ADC that uses a capacitive attenuator to scale down the reference voltage and reduce the loading of the residue amplifier, the third advantage is the self-embedded offset cancellation that reuses the second SAR to cancel the offset voltage.

While the present invention may be susceptible to various modifications and alternative forms, specific embodiments have been shown by way of example in the drawings and will be described in detail herein. However, it should be understood that the techniques set forth in the present disclosure are not intended to be limited to the particular forms disclosed. Rather, the invention is to cover all modifications, equivalents and alternatives falling within the spirit and scope of the disclosure as defined by the following appended claims.

What is claimed is:

1. An analog-to-digital converter (ADC) circuit, comprising:
multiple time-interleaved pipelined-successive approximation register (SAR) ADCs, each of the multiple time-interleaved SAR ADCs comprising:
a first stage SAR sub-ADC for coarse conversion, the first stage SAR sub-ADC receiving and converting an analog input signal to generate a digital code and a residue signal;
a residue amplifier for amplifying the residue signal generated by the first stage SAR sub-ADC to output a amplified residue signal, wherein the residue amplifier is shared between the multiple time-interleaved pipelined-SAR ADCs;
a second stage SAR sub-ADC for fine conversion, the second stage SAR sub-ADC receiving and converting the amplified residue signal to generate a digital code; and a digital error correction logic for receiving and combining the digital code generated by the first stage SAR sub-ADC and the digital code generated by the second stage SAR sub-ADC to generate digital signal that represents the analog input signal,
wherein the first stage SAR sub-ADC comprises a plurality of capacitive digital-to-analog converter (DAC) built as a flip-around Multiplying Digital to Analog Converter (MDAC) for improving feedback factor in the pipelined-successive approximation register (SAR) ADC.

2. The analog-to-digital converter circuit according to claim 1, wherein the DAC comprises an n-bit sub-$DAC_C$ array and a capacitive network sub-$DAC_A$, top-plates of the n-bit sub-$DAC_C$ and the capacitive network sub-$DAC_A$ are connected together, and the capacitive network sub-$DAC_A$ and the n-bit sub-$DAC_C$ sample the input signal simultaneously, where n is an integer greater than 1.

3. The analog-to-digital converter circuit according to claim 2, wherein bottom-plate of sub-DACA is kept connected to a reference voltage and the n-bit comparison is done in sub-DACA during the conversion.

4. The analog-to-digital converter circuit according to claim 2, wherein capacitors in $DAC_A$ are partially feedback to an output of the residue amplifier, and the feedback capacitance is decided by a desired inter-stage gain.

5. An analog-to-digital converter (ADC) circuit, comprising:
multiple time-interleaved pipelined-successive approximation register (SAR) ADCs, each of the multiple time-interleaved SAR ADCs comprising:
a first stage SAR sub-ADC for coarse conversion, the first stage SAR sub-ADC receiving and converting an analog input signal to generate a digital code and a residue signal;
a residue amplifier for amplifying the residue signal generated by the first stage SAR sub-ADC to output a amplified residue signal, wherein the residue amplifier is shared between the multiple time-interleaved pipelined-SAR ADCs;
a second stage SAR sub-ADC for fine conversion, the second stage SAR sub-ADC receiving and converting the amplified residue signal to generate a digital code; and a digital error correction logic for receiving and combining the digital code generated by the first stage SAR sub-ADC and the digital code generated by the second stage SAR sub-ADC to generate digital signal that represents the analog input signal,
wherein the second stage SAR sub-ADC comprises DAC array, a capacitor $C_V$, and an capacitive attenuator,
wherein bottom-plates of the DAC array and the capacitor $C_V$ are connected to reference and common-mode voltages, respectively.

6. The analog-to-digital converter circuit according to claim 5, wherein the residue is sampled at a node between the capacitor and the capacitive attenuator, and the successive approximation conversion is done in the DAC array.

7. An analog-to-digital converter (ADC) circuit, comprising:
multiple time-interleaved pipelined-successive approximation register (SAR) ADCs, each of the multiple time-interleaved SAR ADCs comprising:
a first stage SAR sub-ADC for coarse conversion, the first stage SAR sub-ADC receiving and converting an analog input signal to generate a digital code and a residue signal;
a residue amplifier for amplifying the residue signal generated by the first stage SAR sub-ADC to output a amplified residue signal, wherein the residue amplifier is shared between the multiple time-interleaved pipelined-SAR ADCs;
a second stage SAR sub-ADC for fine conversion, the second stage SAR sub-ADC receiving and converting the amplified residue signal to generate a digital code, wherein the second stage SAR sub-ADC connects to a calibration logic; and a digital error correction logic for receiving and combining the digital code generated by the first stage SAR sub-ADC and the digital code generated by the second stage SAR sub-ADC to generate digital signal that represents the analog input signal, wherein the second stage SAR sub-ADC calculates a offset voltage, and the calibration logic stores a offset code and applies a complementary offset code to the second stage SAR sub-ADC to cancel the offset voltage.

\* \* \* \* \*